(12) United States Patent
McNamara

(10) Patent No.: US 10,063,215 B2
(45) Date of Patent: Aug. 28, 2018

(54) VOLTAGE CONTROLLED EQUALIZER NETWORK

(71) Applicant: MACOM Technology Solutions Holdings, Inc., Lowell, MA (US)

(72) Inventor: Brian J. McNamara, Windham, NH (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 174 days.

(21) Appl. No.: 15/131,327

(22) Filed: Apr. 18, 2016

(65) Prior Publication Data
US 2017/0302254 A1   Oct. 19, 2017

(51) Int. Cl.
*H01P 1/22*     (2006.01)
*H03H 11/24*   (2006.01)
(Continued)

(52) U.S. Cl.
CPC .............. *H03H 11/245* (2013.01); *H01P 1/22* (2013.01); *H03H 7/06* (2013.01); *H03H 7/255* (2013.01);
(Continued)

(58) Field of Classification Search
CPC ...... H03H 11/04; H03H 11/24; H03H 11/245; H03H 7/06; H03H 7/255; H01P 1/22; H04L 25/03878; H04L 25/03885; H04L 27/01
(Continued)

(56) References Cited

U.S. PATENT DOCUMENTS

| 5,144,267 A | * | 9/1992 | West, Jr. ................ H04N 7/102 333/171 |
| 5,789,993 A | | 8/1998 | Comte et al. .................... 333/18 |

(Continued)

FOREIGN PATENT DOCUMENTS

WO    WO 92/10062    11/1992 ............. H04N 7/167

OTHER PUBLICATIONS

"A Wideband CATV Attenuator", Skyworks Solutions, Inc., Oct. 14, 2008, pp. 1-11.
(Continued)

*Primary Examiner* — Stephen E Jones
(74) *Attorney, Agent, or Firm* — Thomas | Horstemeyer, LLP; Michael J. D'Aurelio; Jason M. Perilla

(57) ABSTRACT

An apparatus includes a radio frequency (RF) input port, an RF output port, a variable attenuation network, a first filter network, a second filter network, and a third filter network. The variable attenuation network may be coupled between the RF input port and the RF output port. Attenuation of the variable attenuation network is controlled by a first control signal and a second control signal. The first filter network may be connected between the RF input port and the RF output port. The second filter network may be connected between the variable attenuation network and a ground potential. The third filter network may be connected between the variable attenuation network and the ground potential. The first, the second, and the third filter networks modify performance of the variable attenuation network to produce a particular tilt of a radio frequency signal passing through the apparatus between the RF input port and the RF output port. The particular tilt is selectable by adjustment of at least one of the first and the second control signals.

20 Claims, 11 Drawing Sheets

(51) Int. Cl.
  *H03H 7/06*     (2006.01)
  *H03H 11/04*    (2006.01)
  *H04N 5/44*     (2011.01)
  *H03H 7/25*     (2006.01)
  *H04L 25/03*    (2006.01)
  *H04L 27/01*    (2006.01)

(52) U.S. Cl.
  CPC ....... *H03H 11/04* (2013.01); *H04L 25/03878* (2013.01); *H04L 25/03885* (2013.01); *H04L 27/01* (2013.01); *H04N 5/44* (2013.01)

(58) Field of Classification Search
  USPC ..................... 333/28 R, 81 R; 327/308, 309
  See application file for complete search history.

(56) References Cited

U.S. PATENT DOCUMENTS

| | | | |
|---|---|---|---|
| 6,549,087 B1 | 4/2003 | Hoang et al. | 333/15 |
| 6,919,774 B2 | 7/2005 | Ritchey et al. | 333/81 R |
| 6,973,288 B1 | 12/2005 | Davis et al. | 455/67.11 |
| 7,477,085 B2 | 1/2009 | Stevenson | 327/308 |
| 2003/0062967 A1 | 4/2003 | Ritchey et al. | 333/81 R |
| 2005/0156685 A1 | 7/2005 | Hauger et al. | 333/81 R |
| 2007/0252666 A1 | 11/2007 | Shtrom | 333/262 |
| 2009/0184785 A1 | 7/2009 | Zhao et al. | 333/81 R |

OTHER PUBLICATIONS

"HSMP-3816 High Linearity PIN Diode Pi Attenuator Using a Diode Quad in Low Cost SOT-25 Package", Avago Technologies, Sep. 1, 2010, pp. 1-6.
"A Low-Cost Surface Mount PIN Diode π Attenuator", Avago Technologies, Jul. 13, 2010, pp. 1-8.

\* cited by examiner

VOLTAGE CONTROLLED EQUALIZER NETWORK

FIELD OF THE INVENTION

The present invention relates to signal attenuators generally and, more particularly, to a method and/or apparatus for implementing a voltage controlled equalizer network.

BACKGROUND OF THE INVENTION

Community access television (CATV), also referred to as cable television, is a system of delivering television programming to paying subscribers via radio frequency (RF) signals transmitted through coaxial cables or light pulses transmitted through fiber-optic cables. In CATV distribution networks, lossy equalizer circuits are used to compensate for higher losses in coaxial cable (coax) lines at higher frequency. Depending on the length of the cable run, more loss at lower frequencies is needed. The term "tilt" is used to refer to a loss versus frequency response of an equalizer circuit for CATV infrastructure networks. Currently, network providers install different equalizer (EQ) tilt circuits depending on the length of a cable run and other system conditions. In order to tune the tilt level of the network using conventional methods, a technician has to swap discrete tilt networks with different tilt (i.e., loss vs. frequency response) levels in the field, which is costly. The use of discrete tilt networks forces network installers to maintain a broad range of tilt networks and manually replace tilt networks rather than simply adjusting a tuning voltage to optimize the tilt level.

It would be desirable to implement a voltage controlled equalizer, or "tilt" network.

SUMMARY OF THE INVENTION

The present invention concerns an apparatus including a radio frequency (RF) input port, an RF output port, a variable attenuation network, a first filter network, a second filter network, and a third filter network. The variable attenuation network may be coupled between the RF input port and the RF output port. Attenuation of the variable attenuation network is controlled by a first control signal and a second control signal. The first filter network may be connected between the RF input port and the RF output port. The second filter network may be connected between the variable attenuation network and a ground potential. The third filter network may be connected between the variable attenuation network and the ground potential. The first, the second, and the third filter networks modify performance of the variable attenuation network to produce a particular tilt of a radio frequency signal passing through the apparatus between the RF input port and the RF output port. The particular tilt is selectable by adjustment of at least one of the first and the second control signals.

BRIEF DESCRIPTION OF THE DRAWINGS

Embodiments of the invention will be apparent from the following detailed description and the appended claims and drawings in which:

DETAILED DESCRIPTION OF THE PREFERRED EMBODIMENTS

Embodiments of the present invention include providing a voltage controlled equalizer, or "tilt" network that may (i) use reactive components to modify performance of a voltage variable attenuator, (ii) use reactive components to modify performance of a typical PIN diode attenuator, (iii) use reactive components to modify performance of a FET based attenuator, (iv) use reactive components to modify performance of a digitally controlled attenuator, (iv) be implemented as part of a variable gain amplifier, (v) reduce costs, and/or (vi) allow adjustment of tilt without substituting tilt networks with different tilt levels in the field.

In various embodiments, a voltage variable equalizer (VVE) and/or a method of electronically adjusting the "tilt" or loss versus frequency response of an equalizer circuit for CATV infrastructure networks may be implemented as described herein. The VVE and/or method generally enable the tilt to be adjusted over a wide range using an electrically tuned voltage or current. In various embodiments, a single network may be used in a much wider range of solutions, allowing system optimization without swapping equalizer (EQ) tilt circuits and without costly field service replacement. A single tilt network in accordance with an embodiment of the invention may be used in multiple applications and may be electronically adjusted to optimize performance and eliminate manual labor to replace tilt network if network needs change. Another aspect of a tilt network in accordance with an embodiment of the invention, and for tilt networks in general, is that input and output impedances (e.g., 75 ohm for CATV applications) are generally maintained nearly constant over all operating frequencies. The use of series and shunt attenuation elements maintains the desired impedance and resulting return losses over the range of attenuation and tilt settings.

Figure 1:
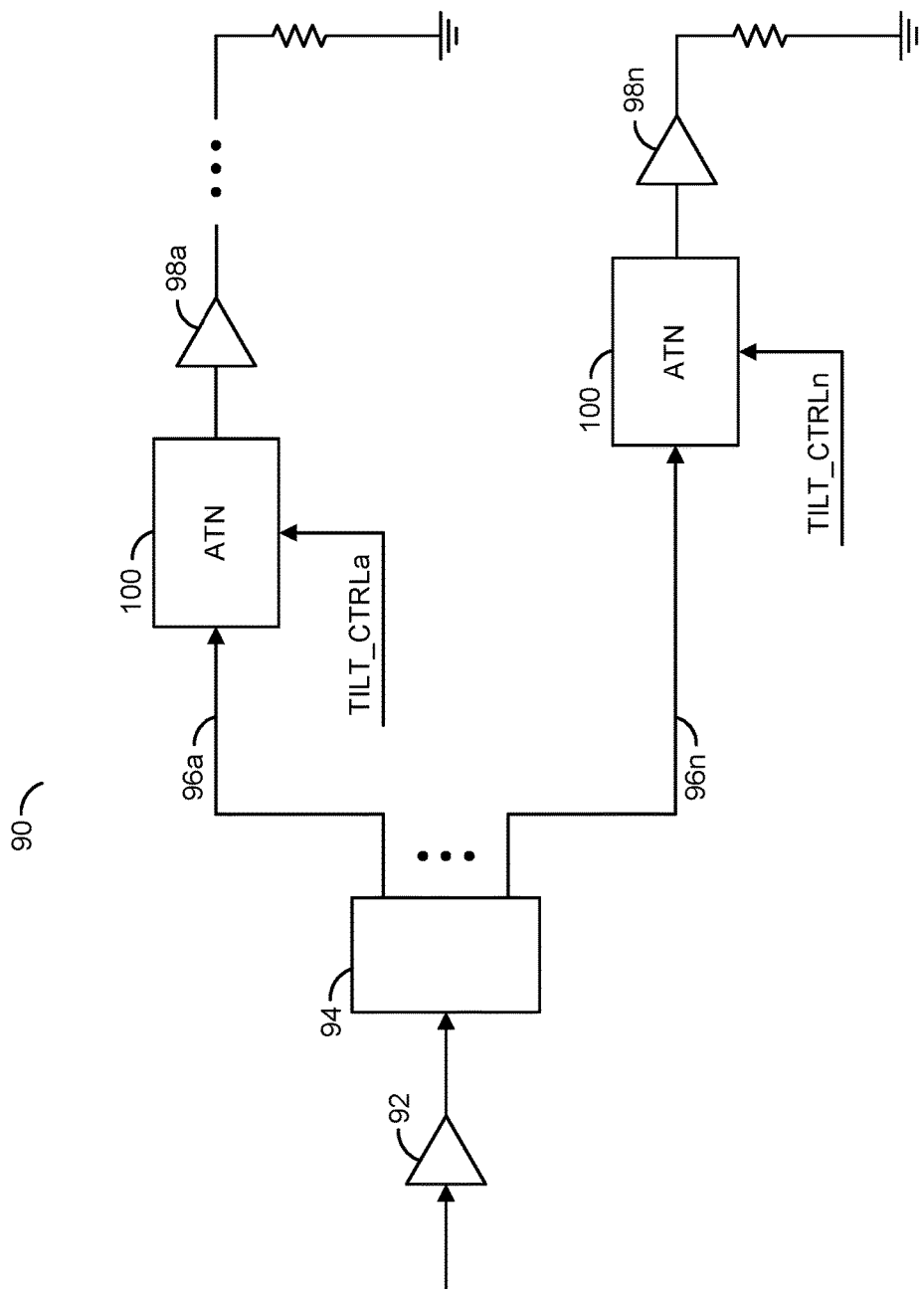
FIG. 1 is a diagram illustrating a community access television (CATV) distribution network.

Referring to FIG. 1, a diagram is shown illustrating a CATV distribution network 90. In an example, the CATV distribution network 90 may include a headend launch amplifier 92, a splitter 94, a plurality of distribution legs 96a-96n, and a plurality of amplifiers 98a-98n. The amplifier 92 generally provides an initial radio frequency (RF) input signal with a known level. The splitter 94 generally splits the input signal power equally between the legs 96a-96n. The ends of each of the distribution legs 96a-96n are terminated with a predetermined impedance. One or more of the distribution legs 96a-96n may include a circuit 100 configured to compensate for an effect of cable losses on the RF input signal. Each of the circuits 100 may comprise an adjustable tilt network implemented in accordance with an embodiment of the invention. Each of the circuits 100 may be configured to vary an amount of tilt compensation provided based upon a respective control signal (e.g., TILT_CTRLa-TILT_CTRLn) to restore the respective RF signals to known levels prior to being presented to the amplifiers 98a-98n. In an example, each of the circuits 100 may be implemented as a voltage-controlled or current-controlled adjustable tilt network (ATN).

Figure 2:
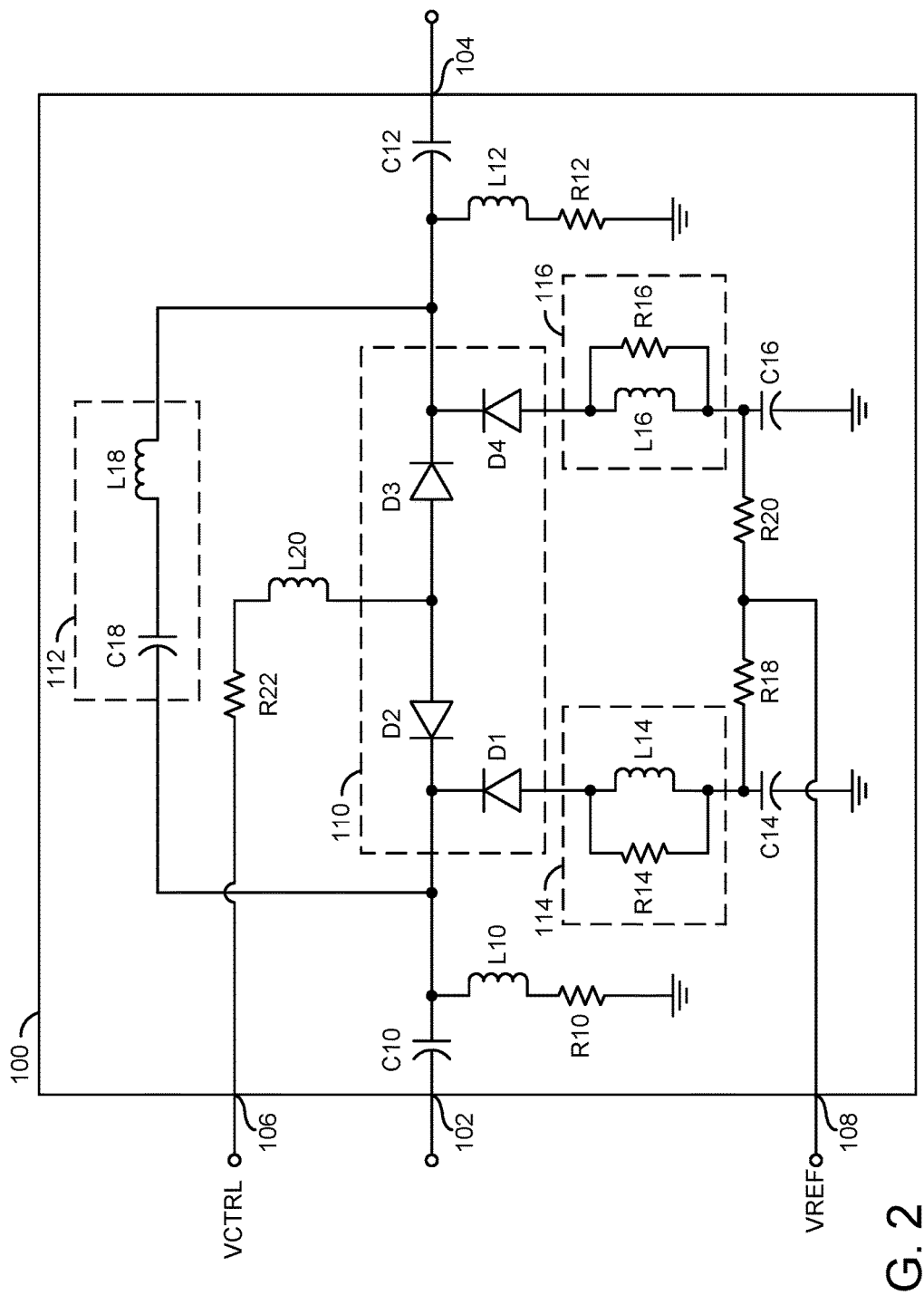
FIG. 2 is a diagram illustrating an example PIN diode implementation of a voltage controlled adjustable tilt network in accordance with an example embodiment of the invention.

Referring to FIG. 2, a diagram is shown illustrating an example implementation of the circuit 100 of FIG. 1 in accordance with an example embodiment of the invention. In various embodiments, the circuit 100 may include an RF input port 102, an RF output port 104, a first control input 106, and a second control input 108. The circuit 100 is generally configured such that an RF signal introduced to the RF input port 102 is controllably attenuated for output at the RF output port 104. The circuit 100 is further configured such that the RF signal introduced to the RF input port 102 is controllably attenuated to set a particular tilt level in response to a first control signal (e.g., VCTRL) presented to the control input 106 and a second control signal (e.g., VREF) presented to the second control input 108. In various embodiments, the signal VCTRL may be implemented as a variable level voltage signal and the signal VREF may be implemented as a fixed level reference voltage. In some embodiments, both the signal VCTRL and the signal VREF may be implemented as variable level voltage signals.

In various embodiments, the circuit 100 may comprise a circuit 110, a circuit 112, a circuit 114, a circuit 116, a capacitor C10, a capacitor C12, a capacitor C14, a capacitor C16, an inductor L10, an inductor L12, an inductor L20, a resistor R10, a resistor R12, a resistor R18, a resistor R20, and a resistor R22. The RF input port 102 is connected to a first terminal of the capacitor C10. A second terminal of the capacitor C10 is connected to a first terminal of the inductor L10, a first input of the circuit 110, and a first input/output of the circuit 112. A second terminal of the inductor L10 is connected to a first terminal of the resistor R10. A second terminal of the resistor R10 is connected to a circuit ground potential.

The RF output port 104 is connected to a first terminal of the capacitor C12. A second terminal of the capacitor C12 is connected to a first terminal of the inductor L12, a first output of the circuit 110, and a second input/output of the circuit 112. A second terminal of the inductor L12 is connected to a first terminal of the resistor R12. A second terminal of the resistor R12 is connected to the circuit ground potential. A second output of the circuit 110 is connected to a first input/output of the circuit 114. A second input/output of the circuit 114 is connected to a first terminal of the capacitor C14 and a first terminal of the resistor R18. A second terminal of the capacitor C14 is connected to the circuit ground potential. A second terminal of the resistor R18 is connected to a first terminal of the resistor R20.

A third output of the circuit 110 is connected to a first input/output of the circuit 116. A second input/output of the circuit 116 is connected to a first terminal of the capacitor C16 and a second terminal of the resistor R20. A second terminal of the capacitor C16 is connected to the circuit ground potential. The first control input 106 is connected to a first terminal of the resistor R22. A second terminal of the resistor R22 is connected to a first terminal of the inductor L20. A second terminal of the inductor L20 is connected to a second input of the circuit 110. The second control input 108 is connected to a node formed by the connection of the second terminal of the resistor R18 and the first terminal of the resistor R20.

In various embodiments, the circuit 110 comprises a PIN diode D1, a PIN diode D2, a PIN diode D3, and a PIN diode D4. The PIN diodes D1, D2, D3, and D4 are chosen such that distortion is not introduced under the desired operating signal levels. For high power CATV infrastructure application, PIN diodes are commonly used for variable attenuator applications (without variable tilt). In various embodiments, the circuit 100 may utilize PIN diodes to deliver adjustable tilt while maintaining high linearity needed in CATV systems. The PIN diodes D1 and D2 are arranged in a common cathode configuration. The PIN diodes D3 and D4 are also arranged in a common cathode configuration. The PIN diodes D2 and D3 are connected in anti-phase or a common anode configuration. The configuration of PIN diodes D2 and D3 improves the dynamic range over the linearity of the structure by having the second order products of one diode canceled out by the opposite, non-linear portion generated in the series diode pair. In various embodiments, PIN diodes providing dynamic impedance range of from approximately one-twentieth up to approximately 20 times a characteristic impedance of the circuit into which the circuit 100 is to be placed.

The filter networks 112, 114, and 116 generally modify performance of the variable attenuation network 110 to produce a particular (e.g., desired) tilt of a radio frequency signal passing through the circuit 100 between the RF input port 102 and the RF output port 104. The desired tilt is selectable by adjustment of one or both of the control voltages VCTRL and VREF.

The capacitors C10 and C12 generally provide DC blocks at the attenuator input and output ports. The capacitors C10 and C12 generally appear as shorts for all RF frequencies but preserve desired DC voltages of the equalizer (EQ) network when connected to input and output loads. In an example, the capacitors C10 and C12 may be implemented with a fairly large capacitance of approximately 1000 pF and the inductors L10 and L12 may be implemented using high impedance ferrite beads. The capacitors C10 and C12 cooperate with the inductors L10 and L12, respectively, to form high pass filters that extend the low frequency performance of the circuit. If lower impedance inductors are used for L10 and L12, lower capacitance capacitors may also be used for capacitors C10 and C12.

The capacitors C14 and C16 generally provide RF shorts to ground. In various embodiments, the capacitors C14 and C16 may be implemented having a capacitance of approximately 10,000 pF. The inductors L10, L12 and L20 generally pass DC bias currents but present high impedance at RF frequencies. In various embodiments, the inductors L10, L12 and L20 may be implemented as ferrite beads providing reactive impedance of approximately 1500 ohms for the desired operating frequencies. In some embodiments, lower inductance values may be used to fine tune performance versus frequency response. The resistors R18 and R20 in combination with the voltages VCTRL and VREF determine currents which then determine an RF impedance of the shunt PIN diodes D1 and D4. The resistors R10, R12, and R22 in combination with the voltages VCTRL and VREF determine currents which then determine an RF impedance of the series PIN diodes D2 and D3.

In various embodiments, the circuit 112 may be implemented as a series coupled LC network. In an example, the circuit 112 may be modeled as a capacitor C18 in series with an inductor L18. However, other filter configurations and/or components may be used to implement the circuit 112 to meet the design criteria and/or frequency characteristic(s) of a particular application. In some embodiments, the circuits 114 and 116 may be implemented as inductive networks (e.g., represented by inductors L14 and L16). In some embodiments, the circuits 114 and 116 may be implemented as parallel coupled LR networks. In an example of the parallel coupled LR network, the circuit 114 may be modeled as a resistor R14 and an inductor L14 connected in parallel. Similarly, the circuit 116 may be modeled as a resistor R16 and an inductor L16 connected in parallel. The circuits 114 and 116 are generally configured to reduce or prevent loss at the high end of the frequency range of the circuit 100.

In an example, initial values for the capacitors C18 and L18 may be chosen such that they are resonant at the highest operating frequency (e.g., Fh) using the following Equation 1:

$$Fh = (\tfrac{1}{2} \ast pi) \ast \mathrm{sqrt}(1/(L \ast C)). \qquad \text{EQ. 1}$$

In an example, an initial value of the inductor L18 may be chosen based on available 0402 chip inductors (e.g., in the range of 1-10 nH). Optimal values for the inductor L18 and the capacitor C18 may be selected based upon simulation or measurement results depending on resulting shape of attenuation vs frequency and return loss results. Initial value of the inductors L14 and L16 may be chosen such that reactance is approximately 2.5 times the input and output reference impedance (Zo) at the highest operating frequency. The resistor R14 may be added to improve return losses over the frequency band. In an example, the resistor R14 may have an initial value of 3*Zo. In an example embodiment, the circuit 100 may be implemented using the following component values: L18=4.7 nH, C18=2.5 pF, L14 and L16=18 nH, R14 and R16=150 ohm, Zo=50 ohms, Fh=1 GHz, VREF=1.5 V.

With the common cathode points of the circuit 110 configured to have a constant DC bias voltage, the circuit 100 provides for separate control of the series PIN diodes D2 and D3, controlled by the signal VCTRL provided to the control input 106, and shunt diodes D1 and D4, controlled by the signal VREF provided to the control input 108. By controlling the levels of the signals VCTRL and VREF, the return loss of the circuit 100 may be optimized for a desired insertion loss and return loss.

Figure 3:
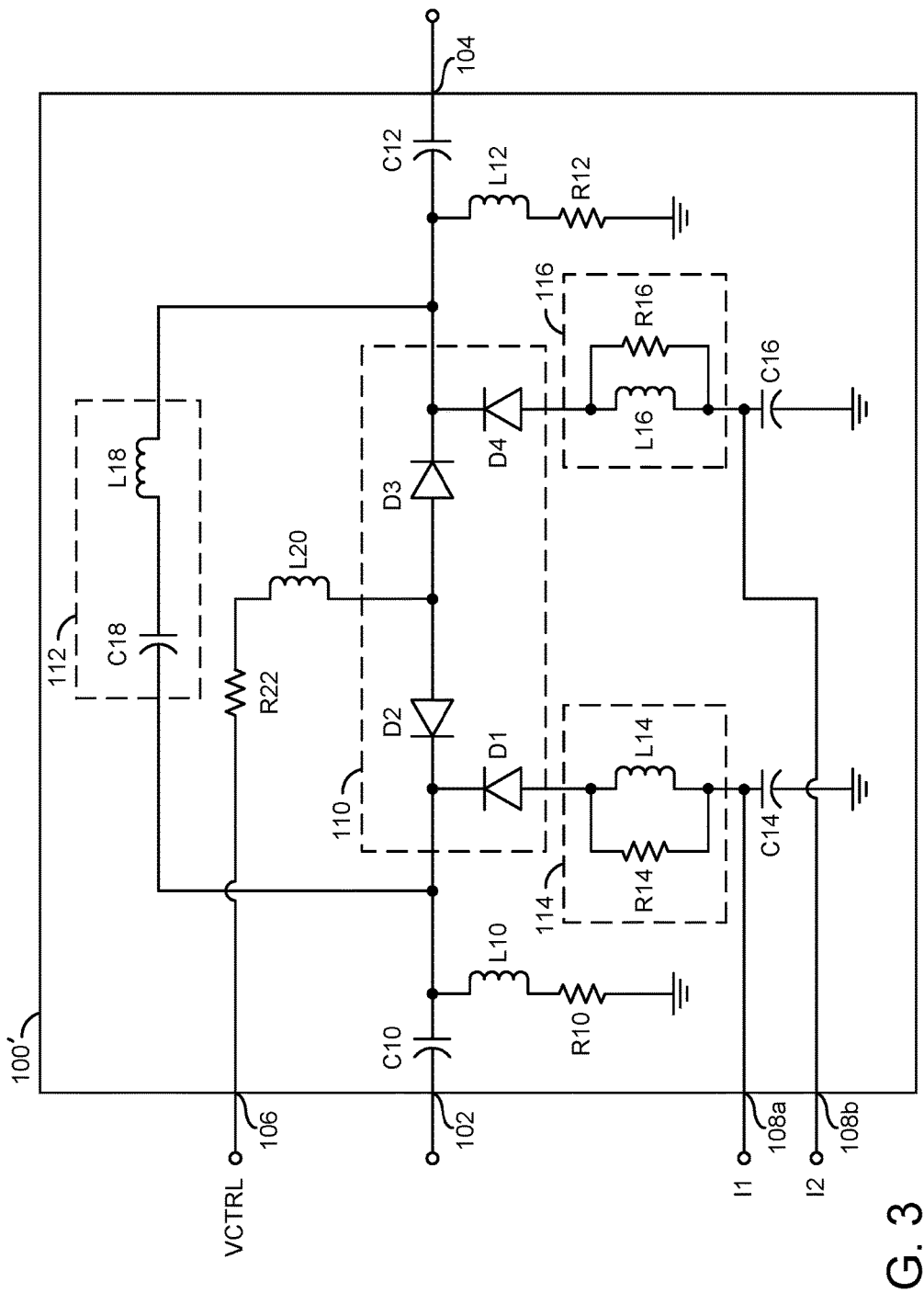
FIG. 3 is a diagram illustrating an example PIN diode implementation of a current controlled adjustable tilt network in accordance with another example embodiment of the invention.

Referring to FIG. 3, a diagram is shown illustrating a circuit 100' in accordance with another example embodiment of the invention. The circuit 100' is generally implemented similarly to the circuit 100, except that the resistors R18 and R20 are omitted and independent control signals (e.g., currents I1 and I2) are provided in place of the voltage VREF.

As described above in connection with FIG. 2, the two shunt diodes, D1 and D4, may be connected through the two series steering resistors R18 and R20. However, as would be appreciated, the use of the steering resistors R18 and R20 is not necessary for implementation of a controllable attenuator in accordance with the invention. In some embodiments, the steering resistors R18 and R20 are omitted and the two shunt diodes, D1 and D4, are provided independent attenuator control currents I1 and I2. The use of two separate control currents provides additional flexibility with respect to optimizing a match on either end of the circuit 100' to the characteristic impedance of the circuit into which the circuit 100' is inserted. In some embodiments, the resistor R22 may also be omitted and the series diodes, D2 and D3, are provided an independent attenuator control current I3 in place of the voltage VCTRL. However, other combinations of control voltages and currents may be implemented accordingly to meet the design criteria of a particular implementation.

Figure 4:
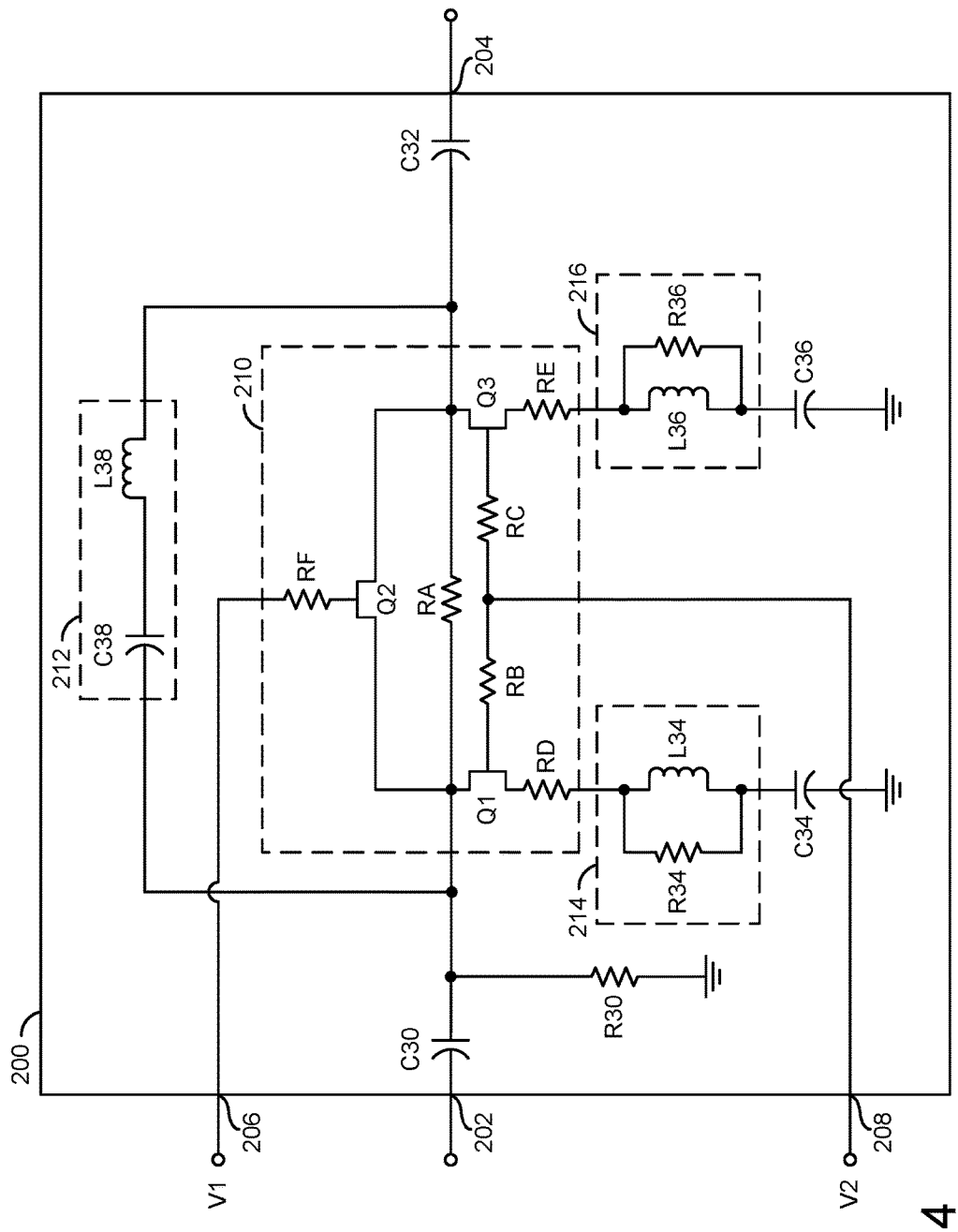
FIG. 4 is a diagram illustrating an example of a field effect transistor (FET) implementation of a voltage controlled adjustable tilt network in accordance with still another example embodiment of the invention.

Referring to FIG. 4, a diagram of a circuit 200 is shown illustrating an example implementation of a voltage controlled adjustable tilt network in accordance with still another example embodiment of the invention. In various embodiments, the circuit 200 may include an RF input port 202, an RF output port 204, a first control input 206, and a second control input 208. The circuit 200 is generally configured such that an RF signal introduced to the RF input port 202 is controllably attenuated for output at the RF output port 204. The circuit 200 is further configured such that the RF signal introduced to the RF input port 202 is controllably attenuated in response to a first control signal (e.g., V1) presented to the control input 206 and a second control signal (e.g., V2) presented to the second control input 208. In various embodiments, the signal V1 may be implemented as a variable level voltage signal and the signal V2 may be implemented as a fixed level reference voltage. In general, both V1 and V2 may be implemented as variable level voltage signals. However, some embodiments may allow operation with a single control voltage at a cost of introducing other performance limitations.

In various embodiments, the circuit 200 may comprise a circuit 210, a circuit 212, a circuit 214, a circuit 216, a capacitor C30, a capacitor C32, a capacitor C34, a capacitor C36, and a resistor R30. The RF input port 202 is connected to a first terminal of the capacitor C30. A second terminal of the capacitor C30 is connected to a first terminal of the resistor R30, a first input of the circuit 210, and a first input/output of the circuit 212. A second terminal of the resistor R30 is connected to a circuit ground potential. The resistor R30 is chosen as a high value resistor (e.g., approximately 20 kilo-ohms).

The RF output port 204 is connected to a first terminal of the capacitor C32. A second terminal of the capacitor C32 is connected to a first output of the circuit 210 and a second input/output of the circuit 212. A second output of the circuit 210 is connected to a first input/output of the circuit 214. A second input/output of the circuit 214 is connected to a first terminal of the capacitor C34. A second terminal of the capacitor C34 is connected to the circuit ground potential.

A third output of the circuit 210 is connected to a first input/output of the circuit 216. A second input/output of the circuit 216 is connected to a first terminal of the capacitor C36. A second terminal of the capacitor C36 is connected to the circuit ground potential. The first control input 206 is connected to a second input of the circuit 210. The second control input 208 is connected to a third input of the circuit 210.

In various embodiments, the circuits 212, 214, and 216 are implemented similarly to the circuit 112, 114, and 116 described above (e.g., in connection with FIG. 2). The circuit 210 comprises a first field effect transistor (FET) Q1, a second field effect transistor (FET) Q2, a third field effect transistor (FET) Q3, and a plurality of resistors (e.g., RA, RB, RC, RD, RE, and RF). The FETs Q1, Q2 and Q3 are generally sized large enough to avoid introducing distortion at expected operating signal levels of the circuit 200. In various embodiments, the circuit 200 may utilize the FETs Q1, Q2, and Q3 to deliver adjustable tilt. The control voltages V1 and V2 are fed to gates of the FETs Q1, Q2, and Q3 via the resistors RB, RC, and RF. The resistors RB, RC, and RF also provide isolation to RF signals. In various embodiments, the resistors RB, RC, and RF are chosen as high value resistors of approximately 5 kilo-ohms.

In embodiments implementing an analog version of the FET variable tilt network, the resistor RA is chosen to be approximately the value of a series resistor in a conventional resistive pi-attenuator that achieves the same attenuation as a maximum desired tilt. The resistors RD and RE are chosen to be approximately the value of the shunt resistor in the conventional resistive pi-attenuator that achieves the same attenuation as the maximum desired tilt. In an example embodiment for application in a 75 ohm system with a target tilt of 20 dB, an initial value for RA may be 371 ohms and initial values for RD and RE may be 91 ohms.

In various embodiments, the circuit 212 may be implemented as a series coupled LC network. In an example, the circuit 212 may be modeled as a capacitor C38 in series with an inductor L38. However, other filter configurations and/or components may be used to implement the circuit 212 to meet the design criteria and/or frequency characteristic(s) of a particular application. In some embodiments, the circuits 214 and 216 may be implemented as inductive networks (e.g., represented by inductors L34 and L36). The circuits 214 and 216 may be implemented as parallel coupled LR networks. In an example, the circuit 214 may be modeled as a resistor R34 and an inductor L34 connected in parallel. Similarly, the circuit 216 may be modeled as a resistor R36 and an inductor L36 connected in parallel. The circuit 214 and 216 are generally configured to reduce or prevent loss at the high end of the frequency range of the circuit 200.

The capacitors C30, C32, C34, and C36 may be implemented similarly to the capacitors C10, C12, C14, and C16 described above (e.g., in connection with FIG. 2). The inductors L34 and L36 may be implemented similarly to the inductors L14 and L16 described above (e.g., in connection with FIG. 2). The capacitor C38 and the inductor L38 may be implemented similarly to the capacitor C18 and the inductor L18 described above (e.g., in connection with FIG. 2).

The circuit 200 generally implements an analog controlled FET attenuator that uses continuous analog voltage control. The voltages V1 and V2 set series and shunt resistances over a continuous range of values to set a desired attenuation. By controlling the levels of the signals V1 and V2, the return loss of the circuit 200 may be optimized for any desired insertion loss and/or return loss.

Figure 5:
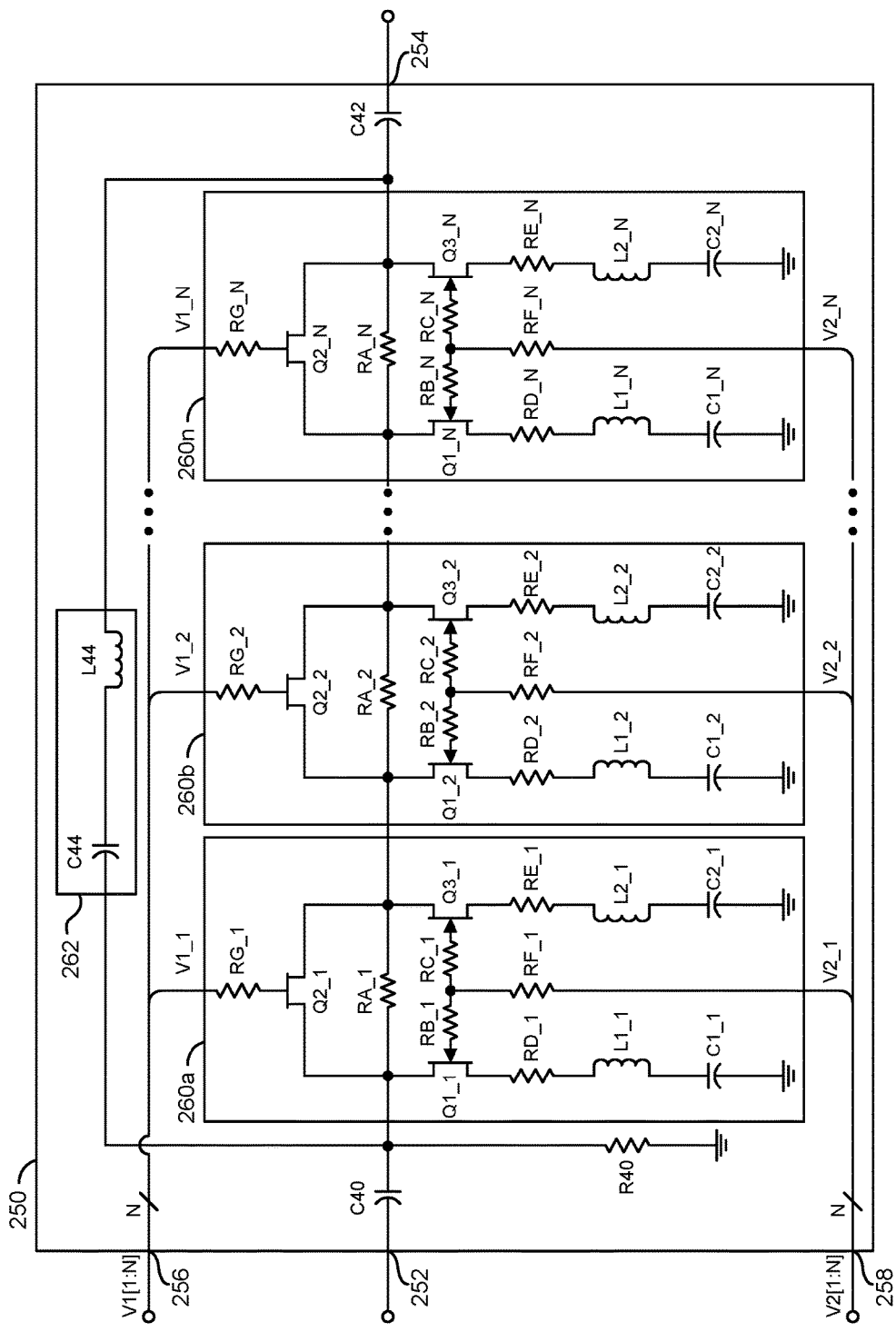
FIG. 5 is a diagram illustrating an example of a FET implementation of a digital voltage controlled adjustable tilt network in accordance with yet another example embodiment of the invention.

Referring to FIG. 5, a diagram of a circuit 250 is shown illustrating an N-bit equalizer in accordance with an example embodiment of the invention. Another technique in accordance with an embodiment of the invention is to implement a digital step attenuator comprising multiple FET attenuator stages. In various embodiments, the circuit 250 may include an RF input port 252, an RF output port 254, a first control input 256, and a second control input 258. The circuit 250 is generally configured such that an RF signal introduced to the RF input port 252 is controllably attenuated for output at the RF output port 254. The circuit 250 is further configured such that the RF signal introduced to the RF input port 252 is controllably attenuated in response to a first digital control signal (e.g., V1[1:N]) presented to the control input 256 and a second digital control signal (e.g., V2[1:N]) presented to the second control input 258. In various embodiments, the signals V1[1:N] and V2[1:N] may be implemented as multi-bit signals. However, some embodiments may allow operation with a single control signal at a cost of introducing other performance limitations.

In various embodiments, the circuit 250 may comprise a plurality of attenuator stages 260a-260n, a circuit 262, a capacitor C40, a capacitor C42, and a resistor 40. The attenuator stages 260a-260n are connected in series. The RF input port 252 is connected to a first terminal of the capacitor C40. A second terminal of the capacitor C40 is connected to a first terminal of the resistor 40, an input of the attenuator stage 260a, and a first input/output of the circuit 262. A second terminal of the resistor 40 is connected to a circuit ground potential. The resistor 40 is chosen as a high value resistor (e.g., approximately 20 kilo-ohms). The RF output port 254 is connected to a first terminal of the capacitor C42. A second terminal of the capacitor C42 is connected to an output of the attenuator stage 260n and a second input/output of the circuit 262. The first control input 256 is connected to a first control input of each of the attenuator stages 260a-260n. The second control input 258 is connected to a second control input of each of the attenuator stages 260a-260n.

Each of the attenuator stages 260a-260n comprises a first field effect transistor (FET) Q1_x, a second field effect transistor (FET) Q2_x, a third field effect transistor (FET) Q3_x, a plurality of resistors (e.g., RA_x, RB_x, RC_x, RD_x, RE_x, RF_x, and RG_x), an inductor L1_x, an inductor L2_x, a capacitor C1_x, and a capacitor C2_x, where x represents the stage numbers 1, . . . , N. The FETs are generally sized large enough to avoid introducing distortion at expected operating signal levels of the circuit 250. In various embodiments, the circuit 250 may utilize the attenuator stages 260a-260n to deliver adjustable tilt. Bits of the control signals V1[1:N] and V2[1:N] are fed to respective gates of the FETs Q1_x, Q2_x, and Q3_x via the resistors RB_x, RC_x, and RG_x. The resistors RB_x, RC_x, and RF_x also provide isolation to RF signals. In various embodiments, the resistors RB_x, RC_x, and RG_x are chosen as high value resistors of approximately 5 kilo-ohms.

In various embodiments, the FETs are either fully ON (~0 ohm, electrical short) or fully OFF (high impedance, electrically open). An attenuation or loss of each stage 260a-260n is set by respective sets of resistors {RA_1, RD_1 and RE_1}, . . . , {RA_N, RD_N and RE_N}. The values of each set of resistors may be set to correspond to pi-attenuator resistors for the desired step in tilt for each bit of the digital step tilt circuit. In an example, for a 2 dB step in the Nth section of the tilt network, RA_N may be set to 17.5 ohm and both RD_N and RE_N may be set to 654 ohms. In each of the stages 260a-260n, the resistor RD_x is coupled to the circuit ground potential through the inductor L1_x and the capacitor C1_x and the resistor RE_x is coupled to the circuit ground potential through the inductor L2_x and the capacitor C2_x, where x represents the stage number. Each of the stages 260a-260n is controlled by a respective set of voltage level signals {V1_1 and V2_1}, . . . , {V1_N and V2_N} presented to a respective set of resistors {RG_1 and RF_1}, . . . , {RG_N and RF_N}.

In various embodiments, the circuit 262 may be implemented as a series coupled LC network. In various embodiments, the circuit 262 is implemented similarly to the circuit 112 described above (e.g., in connection with FIG. 2). In an example, the circuit 262 may be modeled as a capacitor C44 in series with an inductor L44. The capacitor C44 and the inductor L44 may be implemented similarly to the capacitor C18 and the inductor L18 described above (e.g., in connection with FIG. 2). However, other filter configurations and/or components may be used to implement the circuit 262 to meet the design criteria and/or frequency characteristic(s) of a particular application.

Figure 6:
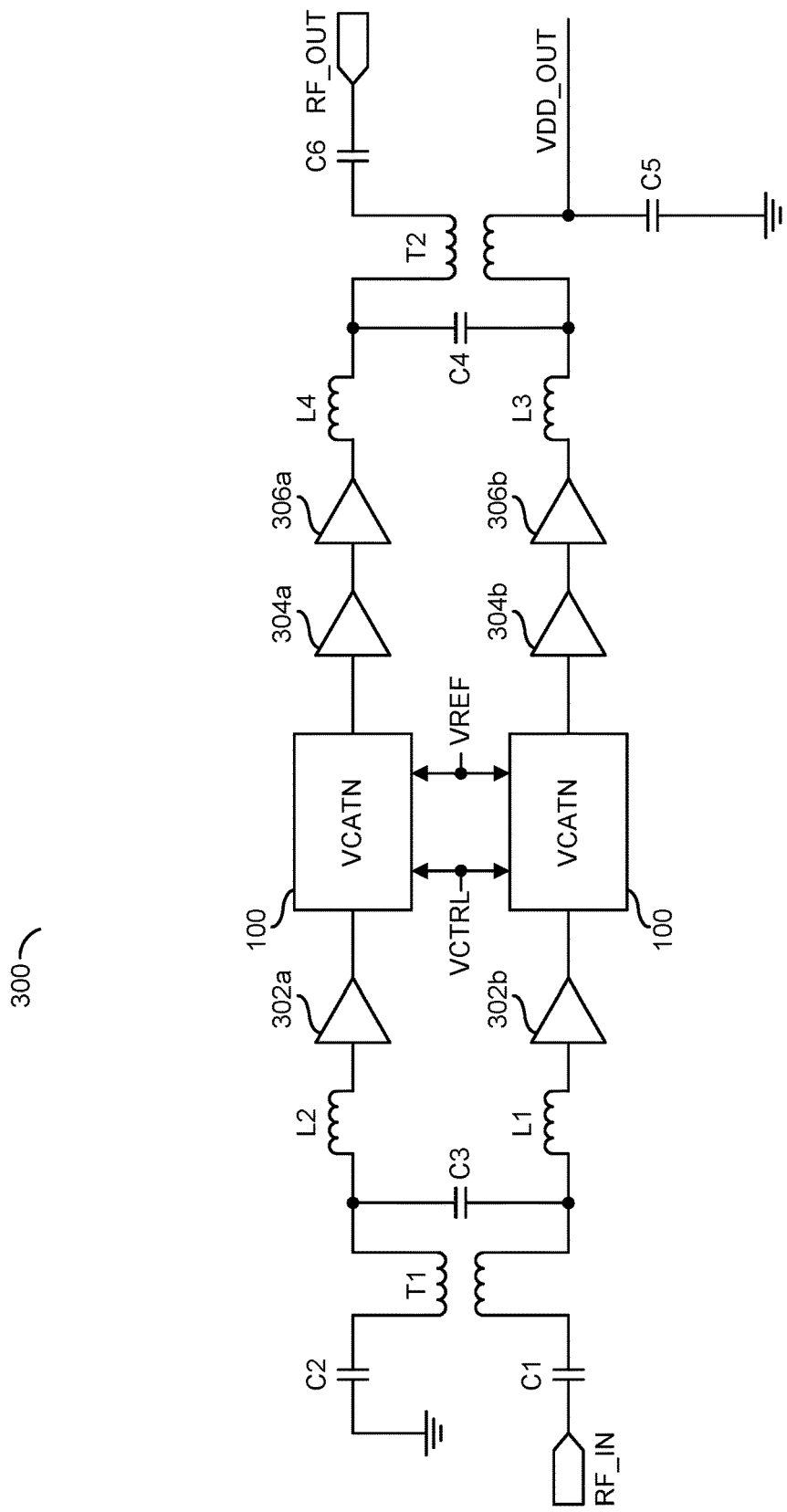
FIG. 6 is a diagram illustrating a voltage controlled adjustable tilt network implemented in the context of a variable gain amplifier for CATV applications.

Referring to FIG. 6, a diagram is shown illustrating two adjustable tilt networks in accordance with an example embodiment of the invention implemented in the context of a variable gain amplifier (VGA) 300. In an example, the VGA 300 comprises a number of differential amplifier stages 302a and 302b, 304a and 304b, and 306a and 306b are coupled in series. In an example, one voltage controlled adjustable tilt network 100 is inserted between the amplifiers 302a and 304a and another voltage controlled adjustable tilt network 100 is inserted between the amplifiers 302b and 304b. The two voltage controlled adjustable tilt network 100 are configured to receive the same control voltages VCTRL and VREF. An RF input signal RF_IN is presented to an input transformer T1 and coupled to the amplifier stages 302a and 302b, 304a and 304b, and 306a and 306b by a network comprising a capacitor C3 and inductors L1 and L2. An RF output signal RF_OUT is presented at an RF output port via a network comprising a pair of inductors L3 and L4, a capacitor C4, a transformer T2, and capacitors C5 and C6. A DC bias (e.g., VDD_OUT) may be applied to the RF output signal via the transformer T2.

Figure 7:
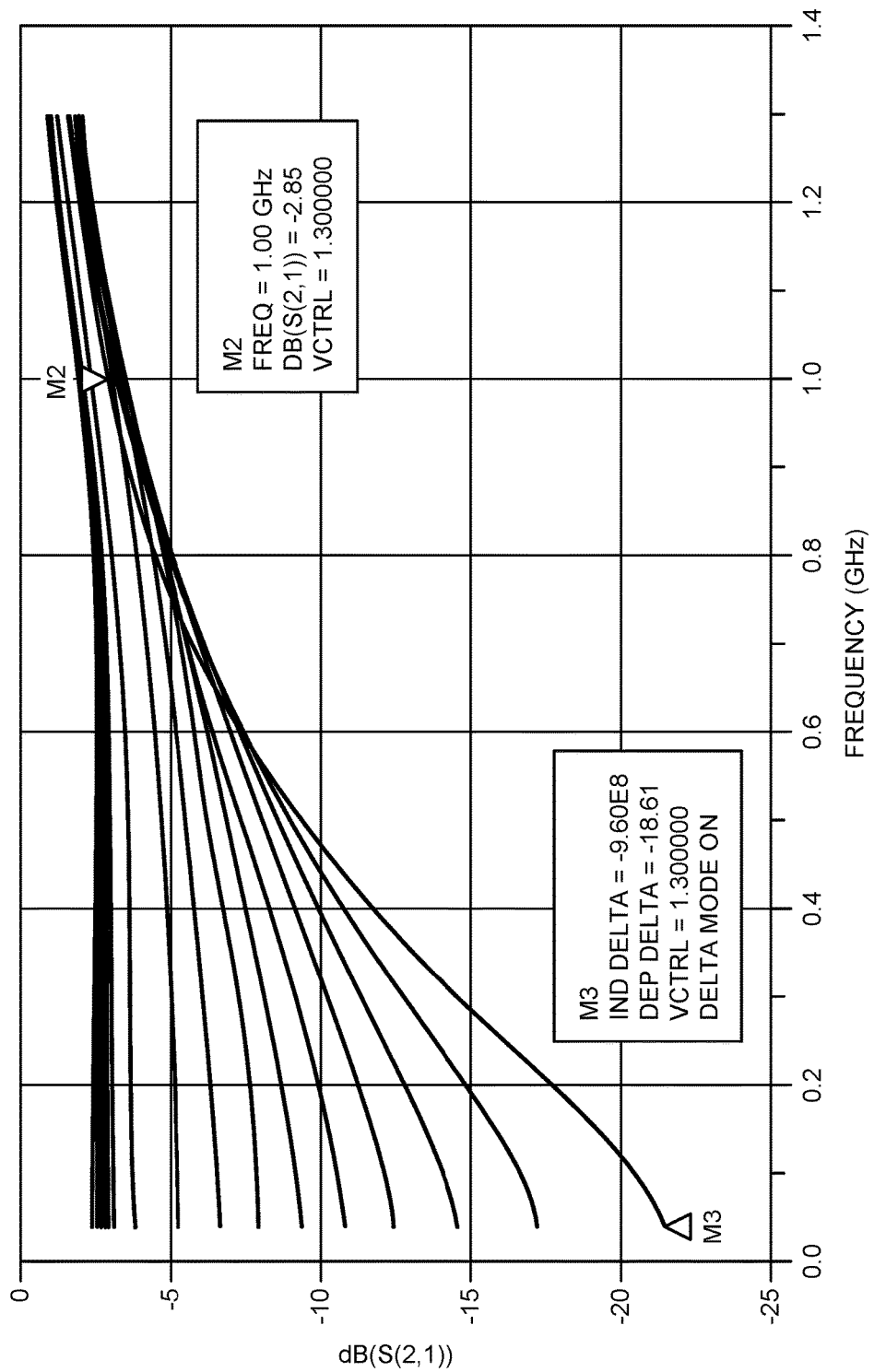
FIG. 7 is a diagram illustrating results of an S-parameter simulation, S(2,1), for the circuit illustrated in FIG. 2.

Referring to FIG. 7, a diagram of a plot illustrating results of an S-parameter simulation, S21, for the circuit 100 illustrated in FIG. 2 is shown. S-parameter measurements S21 are plotted against frequency over a range of control voltages in a PIN diode variable tilt simulation. The plot shows a highest tilt of about 18.61 dB when the control voltage is 1.3V. For higher control voltages the attenuation versus frequency response is flatter, showing the variable tilt achieved with different VCTRL settings.

Figure 8:
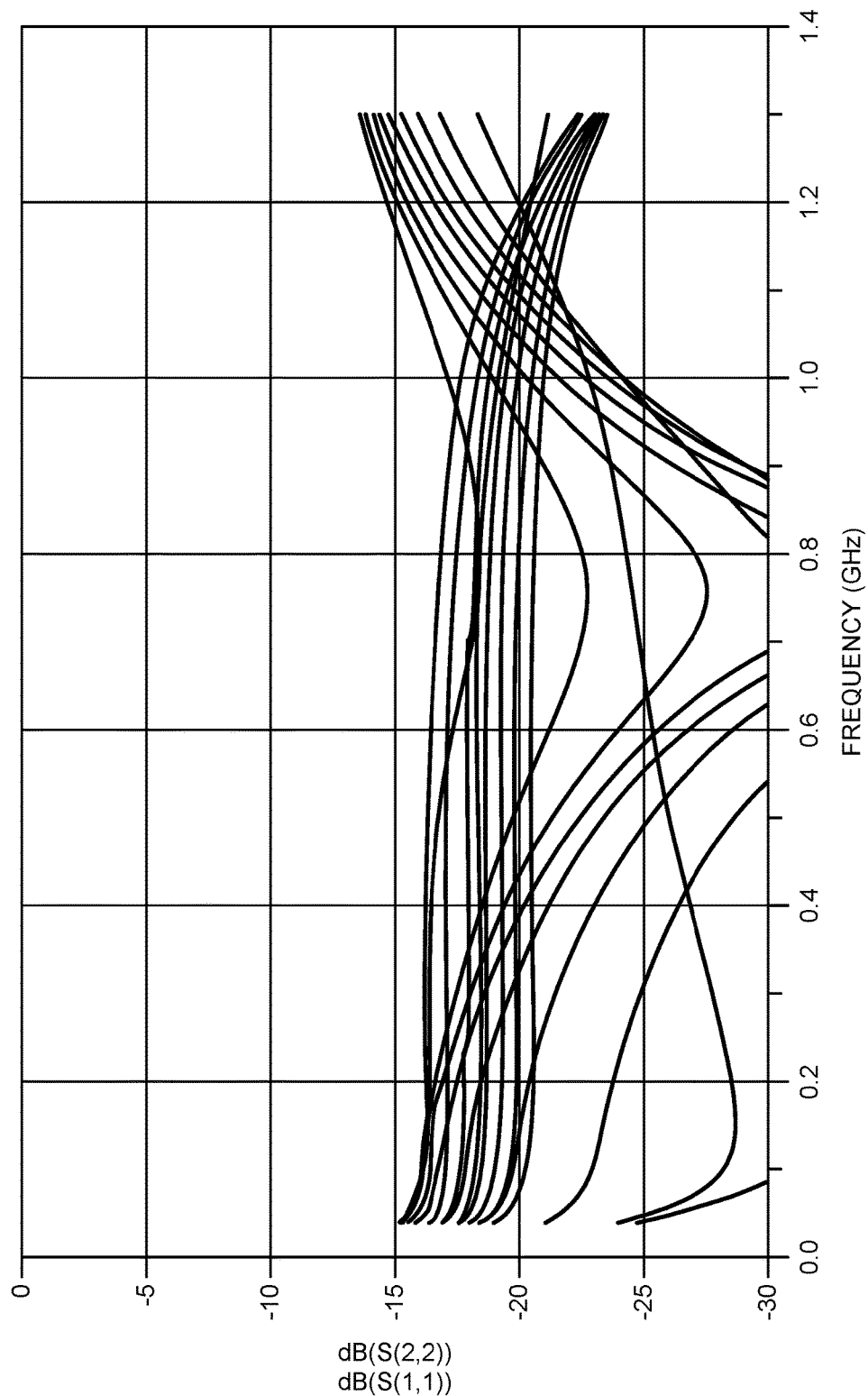
FIG. 8 is a diagram illustrating results of S-parameter simulation, S(1,1) and S(2,2), for the circuit illustrated in FIG. 2.

Referring to FIG. 8, a diagram of a plot illustrating results of S-parameter simulation, S11 and S22, for the circuit 100 illustrated in FIG. 2 is shown. S-parameters S11 and S22 are plotted against frequency over a range of control voltages in a PIN diode variable tilt simulation. As shown in FIG. 8, S11 and S22 remain less than −15 dB over all frequencies and control voltages, which demonstrates that the variable tilt network maintains desired impedance over a range of tilt settings.

Figure 9:
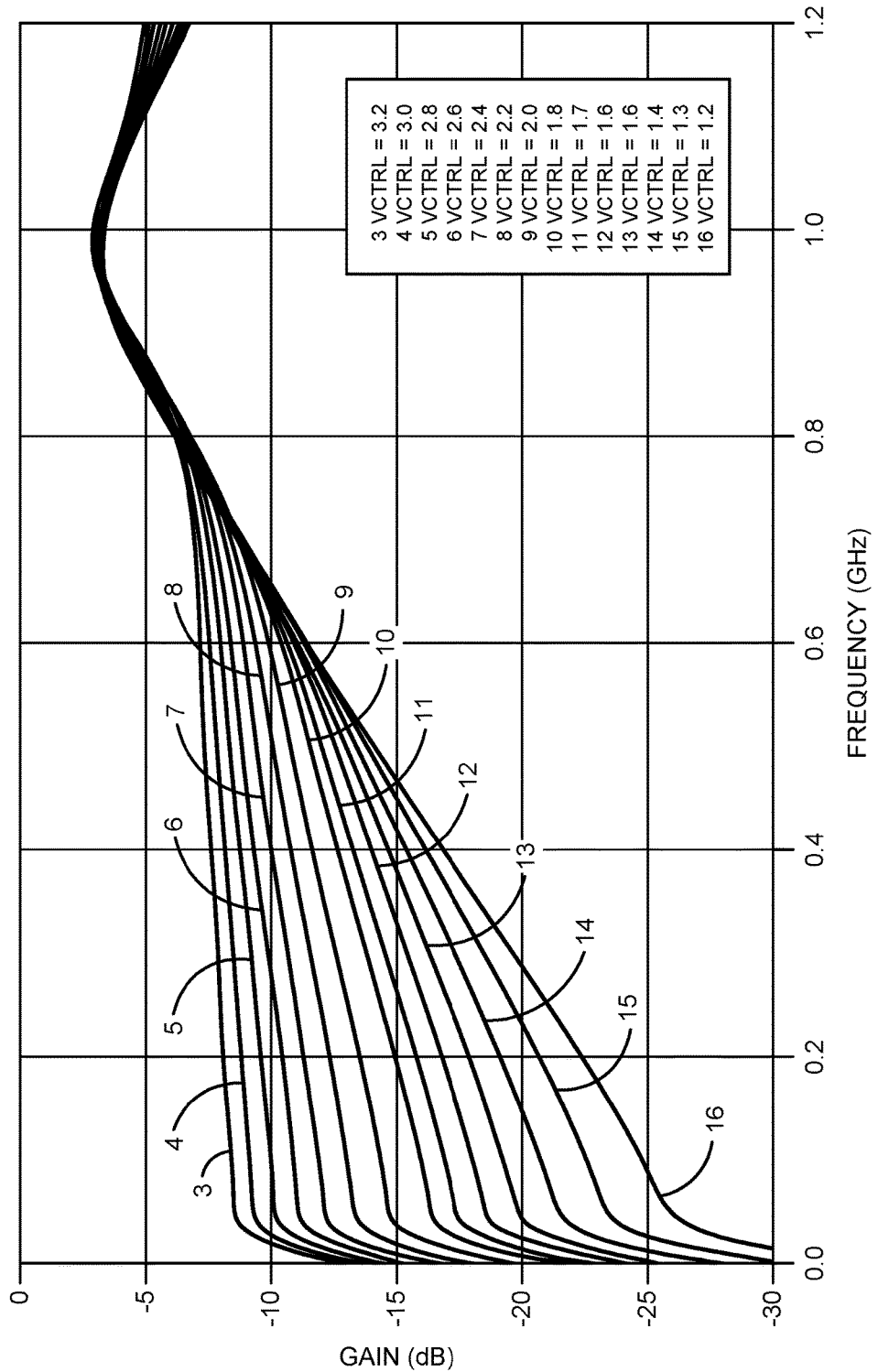
FIG. 9 is a diagram illustrating measurement results of gain versus frequency and control voltage for a circuit implemented according to the circuit of FIG. 2.

Referring to FIG. 9, a diagram is shown illustrating measurement results of gain versus frequency and control voltage for the circuit 100 of FIG. 2 optimized for operation around 1 GHz. Traces are shown for each value of the swept variable VCTRL ranging from 1.2 to 3.2 volts (V). The input VREF is set at a fixed value of 1.6V. A frequency sweep is performed for each value of the swept variable VCTRL.

Figure 10:
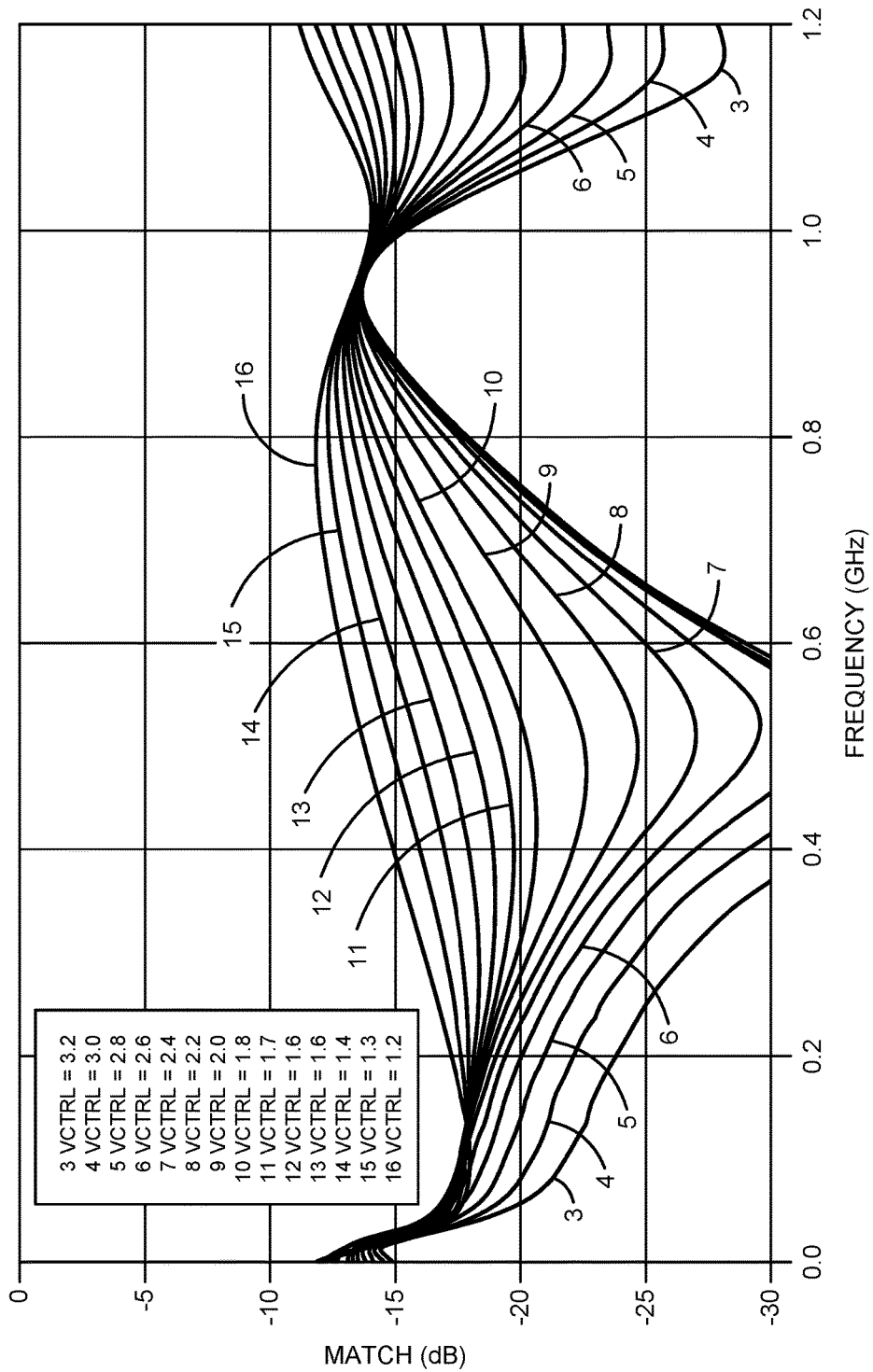
FIG. 10 is a diagram illustrating measurement results of match (S11) versus frequency and control voltage for a circuit implemented according to the circuit of FIG. 2.

Referring to FIG. 10, a diagram is shown illustrating measurement results of match (S11) versus frequency and control voltage (VCTRL) for the circuit 100 of FIG. 2 optimized for operation around 1 GHz. Traces are shown for each value of the swept variable VCTRL ranging from 1.2 to 3.2 volts (V). The input VREF is set to a fixed value of 1.6V. A frequency sweep is performed for each value of the swept variable VCTRL.

Figure 11:
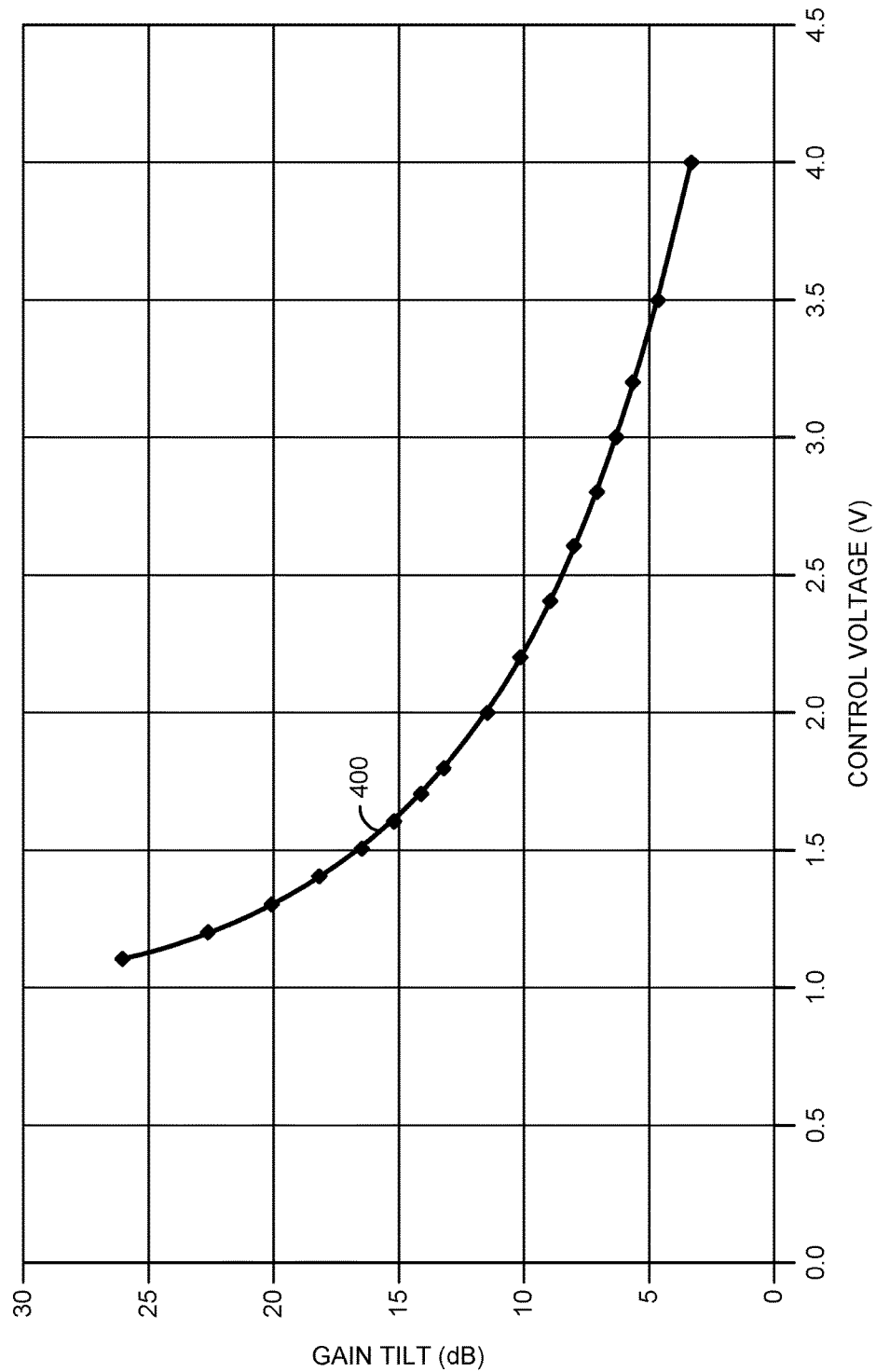
FIG. 11 is a diagram illustrating measurement results of tilt versus control voltage for the circuit of FIG. 2.

Referring to FIG. 11, a diagram is shown illustrating measurement results of Gain Tilt versus control voltage (VCTRL) for the circuit 100 of FIG. 2. The Gain Tilt is calculated as a difference in S21 at 1 GHz and S21 at 50 MHZ. A curve 400 generally illustrates a range of tilt achieved over a range of values of the control voltage VCTRL. In an example, the Gain Tilt varies from approximately 4 dB to 26 dB as the control voltage VCTRL varies from 4V to approximately 1V.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   a radio frequency (RF) input port;
   an RF output port;
   a variable attenuation network coupled between said RF input port and said RF output port, wherein a first terminal of said variable attenuation network is coupled to said RF input port, a second terminal of said variable attenuation network is coupled to said RF output port, and attenuation of said variable attenuation network is controlled by a first control signal and a second control signal;
   a first filter network connected between said RF input port and said RF output port, in parallel with said variable attenuation network;
   a second filter network connected between a third terminal of said variable attenuation network and a first terminal of a first capacitor, wherein a second terminal of said first capacitor is connected to a ground potential; and
   a third filter network connected between a fourth terminal of said variable attenuation network and a first terminal of a second capacitor, wherein a second terminal of said second capacitor is connected to said ground potential, said first, said second, and said third filter networks modify performance of said variable attenuation network to produce a particular tilt of a radio frequency signal passing through the apparatus between said RF input port and said RF output port, and said particular tilt is selectable by adjustment of at least one of said first control signal and said second control signal.

2. The apparatus according to claim 1, wherein said variable attenuation network comprises a plurality of diodes disposed in a pi network configuration.

3. The apparatus according to claim 2, wherein said diodes comprise PIN diodes.

4. The apparatus according to claim 1, wherein said variable attenuation network comprises a plurality of transistors disposed in a pi configuration.

5. The apparatus according to claim 4, wherein said transistors comprise field effect transistors (FETs).

6. The apparatus according to claim 1, wherein said first filter network comprises an LC network.

7. The apparatus according to claim 6, wherein said LC network comprises series coupled capacitance and inductance.

8. The apparatus according to claim 1, wherein said second filter network and said third filter network each comprises an RL network.

9. The apparatus according to claim 8, wherein said RL network comprises parallel coupled resistance and inductance.

10. The apparatus according to claim 1, wherein at least one of said first control signal and said second control signal comprises a voltage level.

11. A method of electronically adjusting a loss versus frequency response of an equalizer circuit, said method comprising:

coupling a variable attenuation network between a radio frequency (RF) input port and an RF output port, wherein a first terminal of said variable attenuation network is coupled to said RF input port, a second terminal of said variable attenuation network is coupled to said RF output port, and attenuation of said variable attenuation network is controlled by a first control signal and a second control signal;

coupling a first filter network between said RF input port and said RF output port, in parallel with said variable attenuation network;

coupling a second filter network between a third terminal of said variable attenuation network and a first terminal of a first capacitor, wherein a second terminal of said first capacitor is connected to a ground potential; and coupling a third filter network between a fourth terminal of said variable attenuation network and a first terminal of a second capacitor, wherein a second terminal of said second capacitor is connected to said ground potential, said first, said second, and said third filter networks modify performance of said variable attenuation network to produce a particular tilt of a radio frequency signal passing through said equalizer circuit between said RF input port and said RF output port, and said particular tilt is selectable by adjustment of at least one of said first control signal and said second control signal.

12. The method according to claim 11, wherein said variable attenuation network comprises a plurality of diodes disposed in a pi network configuration.

13. The method according to claim 12, wherein said diodes comprise PIN diodes.

14. The method according to claim 11, wherein said variable attenuation network comprises a plurality of transistors disposed in a pi configuration.

15. The method according to claim 14, wherein said transistors comprise field effect transistors (FETs).

16. The method according to claim 11, wherein said first filter network comprises an LC network.

17. The method according to claim 16, wherein said LC network comprises series coupled capacitance and inductance.

18. The method according to claim 11, wherein said second filter network and said third filter network each comprises an RL network.

19. The method according to claim 18, wherein said RL network comprises parallel coupled resistance and inductance.

20. The method according to claim 11, wherein at least one of said first control signal and said second control signal comprises a voltage level.

* * * * *